(12) United States Patent
Beems et al.

(10) Patent No.: US 7,349,069 B2
(45) Date of Patent: Mar. 25, 2008

(54) LITHOGRAPHIC APPARATUS AND POSITIONING APPARATUS

(75) Inventors: Marcel Hendrikus Maria Beems, Veldhoven (NL); Joe Sakai, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 11/109,860

(22) Filed: Apr. 20, 2005

(65) Prior Publication Data

US 2006/0238731 A1    Oct. 26, 2006

(51) Int. Cl.
*G03B 27/42* (2006.01)
*G03B 27/62* (2006.01)

(52) U.S. Cl. .................. 355/53; 355/75; 356/500; 356/509

(58) Field of Classification Search .......... 355/30, 355/53, 72, 75; 310/10; 356/498–500, 508–510
See application file for complete search history.

(56) References Cited

U.S. PATENT DOCUMENTS

| | | | |
|---|---|---|---|
| 3,617,126 A * | 11/1971 | Gillespie .................. | 355/72 |
| 4,676,649 A | 6/1987 | Phillips | |
| 4,891,526 A | 1/1990 | Reeds | |
| 5,953,105 A * | 9/1999 | Van Engelen et al. ......... | 355/53 |
| 6,208,407 B1 * | 3/2001 | Loopstra ...................... | 355/53 |
| 6,396,566 B2 * | 5/2002 | Ebinuma et al. ............... | 355/53 |
| 6,509,971 B2 * | 1/2003 | Inoue et al. ................. | 356/487 |
| 6,665,054 B2 * | 12/2003 | Inoue ........................... | 355/77 |
| 6,686,991 B1 * | 2/2004 | Binnard et al. ................ | 355/72 |
| 6,819,404 B2 * | 11/2004 | Tanaka ......................... | 355/72 |
| 6,819,425 B2 * | 11/2004 | Kwan ........................... | 356/399 |
| 2001/0055117 A1 * | 12/2001 | Mizutani ..................... | 356/401 |
| 2004/0109153 A1 * | 6/2004 | Vroman et al. ............... | 355/75 |
| 2004/0263846 A1 | 12/2004 | Kwan | |

FOREIGN PATENT DOCUMENTS

EP    1420299    5/2004
WO    2005/078526    8/2005

OTHER PUBLICATIONS

Written Opinion in Singapore Patent Appl. No. 200602542-3, dated Apr. 10, 2007.
European Search Report for EP Appl. No. 06075927.1-2222 issued Dec. 28, 2006.
Invar (XP-002408089) Wikipedia, 1 page, Nov. 20, 2006; URL:http://en.wikipedia.org/wiki/Invar.

* cited by examiner

*Primary Examiner*—D. Rutledge
(74) *Attorney, Agent, or Firm*—Pillsbury Winthrop Shaw Pittman LLP

(57) ABSTRACT

A lithographic apparatus comprises a substrate table to hold a substrate, a reference structure and a measurement system to measure a position of the substrate table with respect to the reference structure. The measurement system comprises a first measurement system to measure a position of the substrate table with respect to an intermediate structure and a second measurement system to measure a position of the intermediate structure with respect to the reference structure. The intermediate structure may be connected or connectable to a drive mechanism to drive the substrate table. A distance between the substrate table and the intermediate structure, resp. a distance between the intermediate structure and the reference structure may be small which results in a highly accurate position measurement.

33 Claims, 5 Drawing Sheets

LITHOGRAPHIC APPARATUS AND POSITIONING APPARATUS

BACKGROUND

1. Field of the Invention

The present invention relates to a lithographic apparatus and a positioning apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus according to the state of the art may include a substrate table which is constructed to hold a substrate. Whether usage is made of the so-called stepper or the so-called scanner, in each case it is required that the substrate table is movable over a relatively large distance, e.g. to irradiate different part of the substrate, to perform measurements on different parts of the substrate, to exchange the substrate, etc. Due to high accuracy which is required for the pattern which is to be brought onto the substrate in any way, a high positioning accuracy of the substrate is required.

To achieve an accurate positioning, The lithographic apparatus includes a measurement system to measure a position of the substrate table, e.g. with respect to a reference structure such as the metrology frame which may also serve as a reference for a projection system of the lithographic apparatus. Due to their inherent high accuracy's, interferometers may be used in the measurement system to measure the position of the substrate table. For this purpose, several types of interferometers are known, an example being described in Agilent's Laser and Optics User's Manual (p/n 05517-90045). The measurement system may detect the position of the substrate table in e.g. a two dimensional plane, however commonly several other degrees of freedom are measured too, including e.g. a rotation of the substrate table, a height with respect to the two dimensional plane, etc. Due to the large range of movement which is required for the substrate table as has been described above, a length of a measurement beam of an interferometer comprised in the measurement system may very significantly depending on a position of the substrate table. If the substrate table is at its current position relatively close to a particular interferometer, then a beam length of that particular interferometer will be relatively short, while if the substrate table is at another instance at a position relatively remote from that particular interferometer, then the beam length of the measurement beam of that particular interferometer might be relatively long. In a practical implementation, an interferometer beam length may extend up to a distance in an order of magnitude of e.g. 0,5 meters. The possibly large and varying interferometer beam length results in a deterioration of a measurement accuracy of the interferometer. As known, a read out of an interferometer is dependent on a wavelength of the interferometer beam. This wavelength in turn depends on a plurality of physical quantities, amongst which a temperature, an atmospheric pressure of a gas through which the interferometer beam travels, etc. Due to all kind of disturbance factors, such as a movement of the substrate table, movements of any other movable part of the lithographic apparatus generation of heat, airflow, etc, variations in such physical parameters which have an influence on the wavelength of the interferometer beam may occur, thus affecting or locally affecting a wavelength of the interferometer beam. Therefor, an accuracy of the measurement system is limited by these factors, which may result in a limitation in an accuracy to position the substrate table, which may in turn lead to a limitation in an accuracy in applying the pattern on the substrate.

SUMMARY

It is desirable to provide an accurate measurement system to measure a position of a substrate table or any other movable part of a lithographic apparatus or of any other positioning apparatus.

According to an embodiment of the invention, there is provided a lithographic apparatus comprising a substrate table constructed to hold a substrate, a reference structure, and a measurement system to measure a position of the substrate table with respect to the reference structure, wherein the measurement system comprises a first measurement system to measure a position of the substrate table with respect to an intermediate structure, and a second measurement system to measure a position of the intermediate structure with respect to the reference structure.

In another embodiment of the invention, there is provided a positioning apparatus comprising a substrate table constructed to hold a substrate, a reference structure, and a measurement system to measure a position of the substrate table with respect to the reference structure, wherein the measurement system comprises a first measurement system to measure a position of the substrate table with respect to an intermediate structure, and a second measurement system to measure a position of the intermediate structure with respect to the reference structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
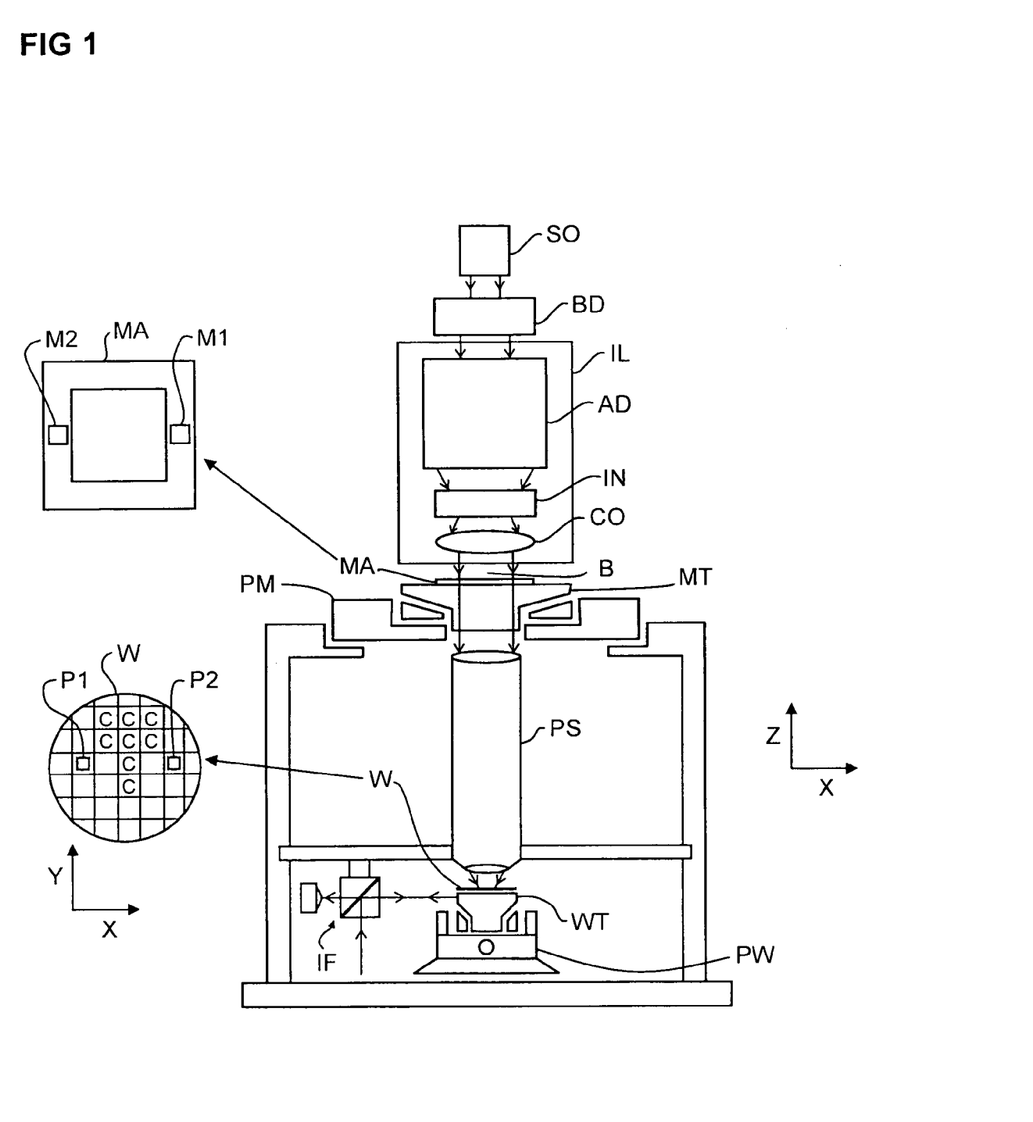
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
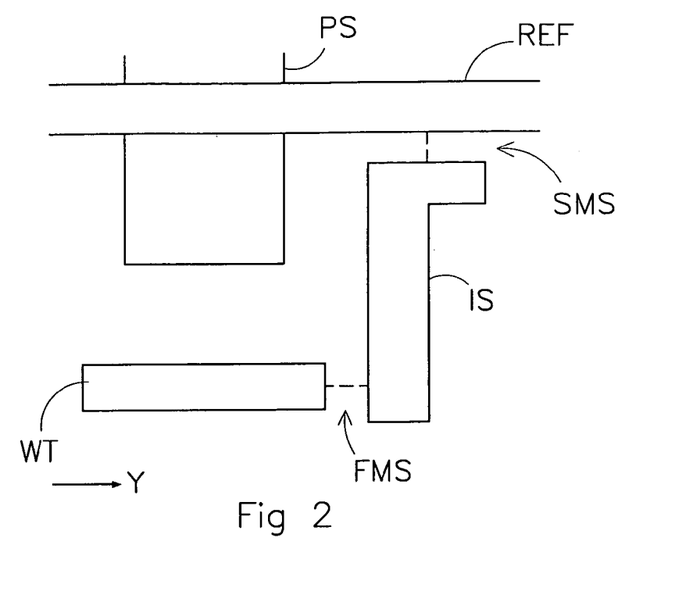
FIG. 2 highly schematically depicts a part of a lithographic apparatus according to an embodiment of the invention.

FIG. 2 highly schematically depicts a side view of the substrate table WT, the projection system PS and a reference frame or reference structure REF in this example comprising e.g. a metrology frame. The projection system PS may be mounted to the reference frame REF. The substrate table WT may e.g. comprise a mirror block, e.g. comprising a body made of a glass which is provided with reflective coatings on at least a part of a surface thereof. This facilitates distance measurements with interferometers, as in such embodiment the substrate table functions as a mirror, thus making additional parts superfluous, thus preventing additional tolerances which could be caused thereby. As the view of FIG. 2 is a highly schematic side view, it does not depict that the reference structure may comprise a 3-dimensional structure, as will be explained in more detail below. FIG. 2 further shows an intermediate structure IS (also referred to in this document as intermediate frame or frame), which in this embodiment extends between the substrate table WT and the reference structure REF, leaving a small opening between the substrate table WT and the intermediate structure IS as well as a small opening between the intermediate structure IS and the reference frame REF. A first measurement system (which is not shown in detail in FIG. 2 but will be explained in more detail with reference to FIGS. 3 and 4) is shown to measure a position of the substrate table WT with respect to the intermediate structure IS. Further, FIG. 2 shows a second measurement system SMS to measure a position of the intermediate structure IS with respect to the reference structure REF. Of course, it is also possible that the first measurement system measures a position of the intermediate structure with respect to the substrate table and/or that the second measurement system measures a position of the reference structure with respect to the intermediate structure. As by the first and second measurement system, a position of the substrate table WT with respect to the intermediate structure, and a position of the intermediate structure with respect to the reference structure is known, a position of the substrate table WT with respect to the reference structure REF is derivable therefrom. Further, in this embodiment a distance between the substrate table WT and the intermediate structure is short, leading to measurement beams of the first measurement system, schematically indicated in FIG. 2 by a line between the substrate table and the intermediate structure, which are short. Similarly, a distance between the intermediate structure and the reference structure is short leading to measurement beams between the intermediate structure and the reference structure, the measurement beams being schematically indicated in FIG. 2 by a line between the intermediate structure and the reference structure, which are short. Thus, wavelength induced measurement errors as might occur in the measurement system according to the state of the art, may be prevented to a large extent as an optical path which the measurement beam is required to travel between the respective parts, is substantially shortened in the embodiment as described here. A further advantage of the relative shortness of the measurement beams is that alignment errors are less likely to occur and a beam shift may be very small, because of the relative shortness of an optical path to be traveled by the respective beam or beams.

The principle as illustrated above with reference to FIG. 2 will now be explained in more detail with reference to FIG. 3 and FIG. 4.

Figure 3:
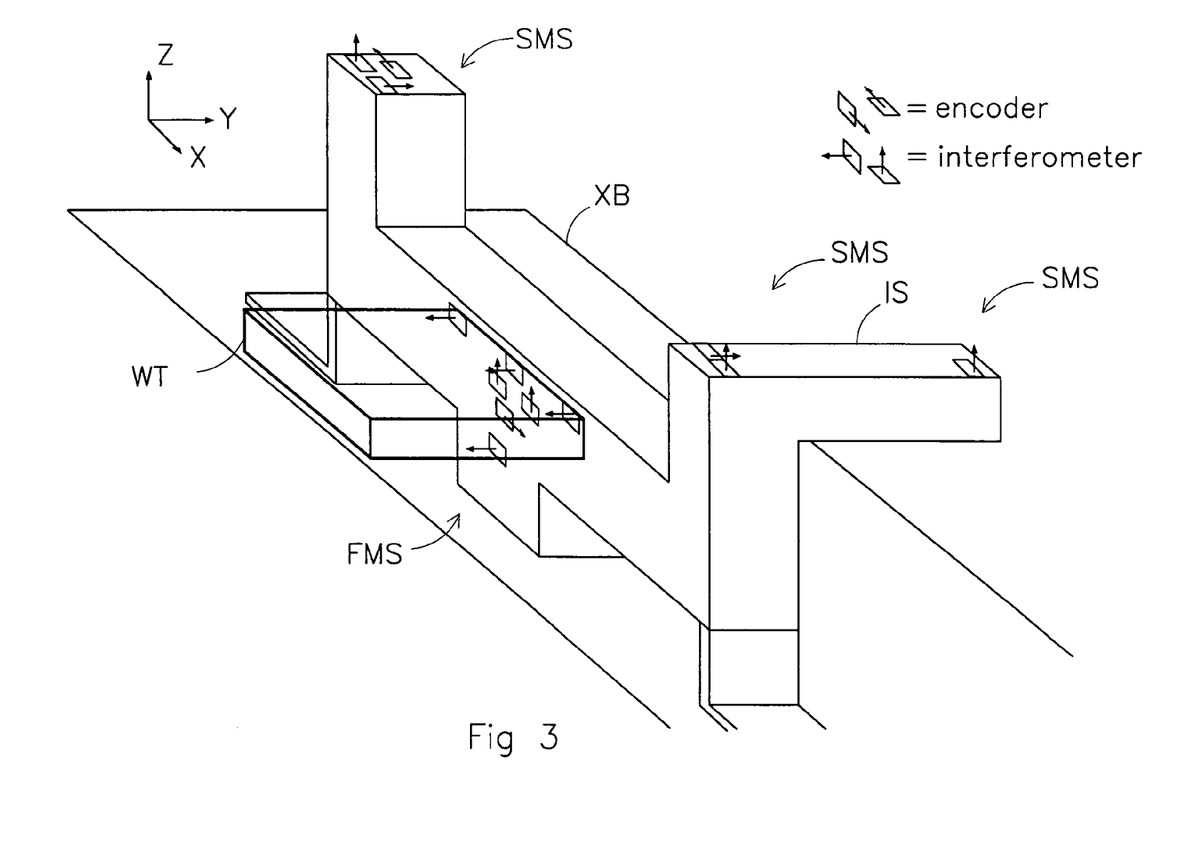
FIG. 3 depicts a perspective view of the embodiment according to FIG. 2.

FIG. 3 shows the substrate table WT, and the intermediate structure IS. The reference structure has not been drawn for clarity reasons, however the skilled person will understand that the reference structure may be located over a top surface of the intermediate structure, a surface of the reference structure facing the intermediate structure being substantially parallel to a plane defined by the axis X and Y as defined in FIG. 3. FIG. 3 further shows an X-beam which may be comprised in a drive mechanism to move the substrate table along first axis indicated here as the Y-axis. The X-beam may therefor interface with a structure which extends along the Y-axis (not shown), the X-beam being movable with respect to such structure by any type of actuator, such as a linear motor. The actuator and the X-beam XB may form a first drive mechanism to move the substrate table along the first axis (i.e. the Y axis). The intermediate structure is connected or connectable to the X-beam, thus in general wording to the first drive mechanism, the intermediate structure thus following a movement of the substrate table along the first axis. Thus, if the substrate table is moved by the first drive mechanism along the Y axis, the intermediate structure will follow this movement, as the intermediate structure is connected or connectable to the first drive mechanism, in this example e.g. connected to the X-beam XB. An advantage is that a distance between the substrate table and the intermediate structure does not or not significantly change when moving the substrate table along the first axis. Also, a distance between the intermediate structure and the reference structure does not change significantly, as the surface of the reference structure extends above the intermediate structure. Thus, the advantages of the invention as described above remain present when moving the substrate table along the Y-axis as the intermediate structure is able to follow or substantially follow such movement, thus hardly or not affecting a distance between the substrate table and the intermediate structure, as well as a distance between the intermediate structure and the reference structure. The substrate table may be connectable to the drive mechanism by a clamping or other releasable mechanism, allowing the substrate table to be separated from the drive mechanism by releasing the clamping mechanism or other releasable mechanism, thus enabling the substrate table to be handled independently of the drive mechanism e.g. by another drive mechanism, such as may be the case in a so called dual stage lithographic apparatus.

The lithographic apparatus may further comprise a second drive mechanism to move the substrate table along the X-axis, also indicated here as second axis. Thus, when the substrate table WT is to be moved along the X-axis, the second drive mechanism (not shown) moves the substrate table WT with respect to in this embodiment the X-beam XB. When the substrate table WT is moved by the second drive mechanism along the X-axis, a distance between the substrate table WT and the intermediate structure IS remains substantially constant, as a surface of the intermediate structure facing the substrate table WT extends substantially parallel to the X-axis. Summarizing, a movement of the substrate table along the Y-axis will be followed by the intermediate structure IS, thus not or only insignificantly affecting a distance between the substrate table and the intermediate structure as well as a distance between the intermediate structure and the reference structure, while a displacement of the substrate table WT along the X-axis leads to a displacement of the substrate table WT with respect to the intermediate structure IS along the X-axis, as the intermediate structure does not or substantially not follow such movement in this embodiment, thus not affecting a distance between the substrate table WT and the intermediate structure. Also, in the case of the movement of the substrate table along the X-axis, a distance between the intermediate structure and the reference structure is not changed, as the intermediate structure in this embodiment does not move in that case with respect to the reference structure. Thus, the embodiment as shown in FIG. 3 makes it possible to move the substrate table WT in both X and Y directions, while substantially maintaining a same distance between the substrate table WT and the intermediate structure as well as between the intermediate structure and the reference structure. In the embodiment shown in FIG. 3, the first measurement system FMS generates a plurality of first (optical) measurement beams between the intermediate structure and the substrate table, these measurement beams being in a direction substantially parallel to the first axis, thus the Y-axis. Likewise, the second measurement system SMS may generate a plurality of second (optical) measurement beams between the intermediate structure and the reference structure, the second measurement beams being in a direction perpendicular to the Y-axis such as in this embodiment substantially perpendicular to the plane defined by the X and Y axes. A more detailed description of the first and second measurement system will follow below. It is noted that, due to the effect that the distances between the substrate table and the intermediate structure and between the intermediate structure and the reference structure stay substantially unchanged despite movements of the substrate table along the X-axis and/or Y-axis, a length of the measurement beams of the first and second measurement systems does not or not substantially change, thus the beam lengths of the measurement beams of the first and second measurement systems staying at there short length, substantially independently of a position or position movement of the substrate table WT. Therefore, any effect which would deteriorate an accuracy of the position measurements by the first a second measurement systems, is hardly present, as the measurement beams keep their relatively short lengths over a wide range of movement of the substrate table. With the current state of the art, it may be impossible to keep these short lengths with large movements of the substrate table.

Further, with the current state of the art, at multiple sides of the substrate table a mirror is needed, while with the present invention only a mirror at one side of the substrate table may be needed. The present invention therefore reduces cost of and gives design freedom of the substrate table.

It is noted that in the embodiment described with reference to FIG. 3, the second drive mechanism is arranged to move the substrate table with respect the first drive mechanism, however also other embodiments are possible, the second drive mechanism may e.g. move the substrate table with respect to a same reference as the first drive mechanism. Similarly as described with reference to the first drive mechanism, the second drive mechanism may also comprise any type of suitable actuator, such as a linear motor, etc. Further, it is noted that in an alternative embodiment, the second measurement system SMS may also comprise second measurement beams which are substantially parallel to the second axis; providing same or similar advantages as the embodiments as described here. It is noted that the arrows as depicted in the symbols representing sensors of the first and second measurement systems FMS, SMS, do not indicate a direction of the measurement beam. In stead these sensors indicate a direction along which the respective sensor provides position information, thus a direction along which position information is provided by the respective position sensing device. The first and second measurement systems will now be described in more detail with reference to FIG. 4.

Figure 4:
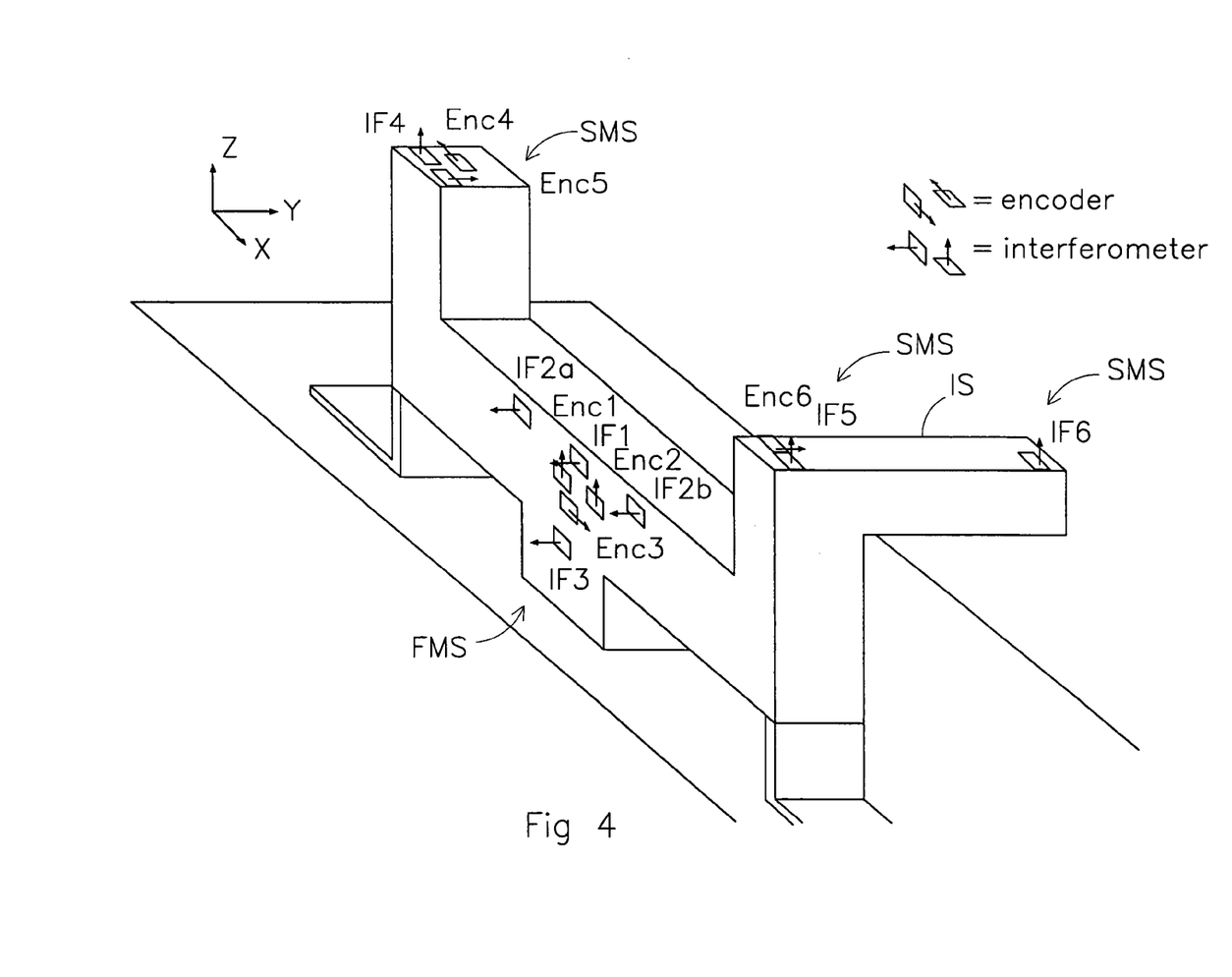
FIG. 4 depicts another perspective view of the embodiment according to FIG. 2.

As depicted in FIG. 4, the first measurement system comprises a plurality of interferometers and a plurality of encoders. The interferometers as well as the encoders comprise a measurement beam which extends substantially parallel to the first axis, thus the Y-axis. By such a combination of interferometers and encoders, it is possible to perform a position measurement of the substrate table WT (which has been left away in FIG. 4 for clarity reasons) and the intermediate structure, without affecting a beam length when moving the substrate table substantially parallel to the X-axis, the movement of the substrate table WT being relative to the intermediate structure IS. In the embodiment described here, the first measurement system comprises a first interferometer IF1, second interferometers IF2A, IF2B, and a third interferometer IF3, further, the first measurement system comprises a first encoder Enc1, a second encoder Enc2, and a third encoder Enc3. For illustrative purposes, as already remarked above arrows originating at the respective interferometers and encoders in FIG. 4 indicate a direction of sensitivity of the respective interferometer or encoder. Also, a physical appearance of the respective interferometer and encoder may differ from the highly schematic representation as depicted in FIG. 4. For example, it is possible that measurement beams for the interferometers resp. encoders are delivered by fibre delivery, thus optical fibres being e.g. comprised in the intermediate structure to guide the respective measurement beams to the appropriate locations of the respective interferometers and encoders.

In the embodiment as depicted in FIG. 4, the first interferometer IF1 and the second interferometers IF2A, IF2B, are separated from each other in a direction parallel to the X-axis, the third interferometer IF3 being separated from the first and second interferometers in a direction perpendicular to the X- and Y-axis. Depending on a position of the substrate table with respect to the intermediate structure, either the first interferometer IF1 in combination with second interferometer IF2A may be applied, or a combination of the first interferometer IF1 and the second interferometer IF2B may be applied for position measurement. A large range of movement along the X-axis may be coped with by the second interferometers as an appropriate one of the second interferometers is selected for measurement. In the embodiment as described with reference to FIGS. 3 and 4, it is desired to obtain a position of a center of the substrate table, in this example a middle point of a top surface of the substrate table. True to the relatively large dimensions of the substrate table, and thus the relative long 'arm' between this center and the encoders and interferometers of the first measurement system, any tolerance on a measurement by the first measurement system, in particular a tolerance in a measurement of a rotation of the substrate table around the X-axis, leads to relatively strong errors in a positions of the middle point of the substrate table. Therefore, a distance between the interferometer IF1 and IF3 has been chosen to be large, as the rotation around the X-axis is derived from an output value of the first and third interferometers. For a same reason, a distance between the first and second interferometers is comparably large, as from a read out of these interferometers, a rotation of the substrate table around the Z-axis is derived. Due to the long arm of the middle point of the substrate table towards the first measurement system, a high accuracy of these rotations is required, which is provided by the relatively large distances between the interferometers as mentioned. The first and second encoder Enc1, Enc2, may comprise a scale to measure a position in a direction substantially perpendicular to the X- and Y-axis. The scale may e.g. be connected to the substrate table WT, or may e.g. be comprised in a surface at a side of the substrate table which faces the intermediate structure. Likewise, the third encoder Enc3 may comprise a scale to measure a position in a direction substantially parallel to the second axis, i.e. the X-axis. It is advantageous to connect the scales to the substrate table, or to integrated the scales into the substrate table WT, by using an e.g. reflecting side surface thereof which faces the intermediate structure, thus making it possible to implement the scales in a simple way, as the substrate table may be equipped with one of more reflecting side surfaces already for usage as a mirror by the interferometers IF1, IF2A, IF2B and IF3. Below, an overview is provided of formulas for calculating a position of the substrate table (indicated here a mirror block), with respect to the intermediate structure (indicated here as a frame):

$Rx\_mirrorbl = (IF3-IF1)/(dist\_if3\_if1)$ $Ry\_mirrorbl = (Enc2-Enc1)/(dist\_Enc2\_Enc1)$ $Rz\_mirrorbl = (IF2x-IF1)/(dist\_if2x\_if1)$ (IF2x can be IF2a or IF2b, depending on the x position of the mirrorblock)

$X\_mirrorbl = Enc3 + Rz\_mirrorbl * (Ywaferstage-Y0)$
Y0=distance between the center of the chuck and the side of the chuck)

$Y\_mirrorbl = IF1 + Rx\_mirrorbl * Dist\_IF1\_focus$, Zcomponent $Z\_mirrorbl = (Enc1+Enc2)/2 + Rx\_mirrorbl * (Ywaferstage-Y0)$ wherein Rx, Ry, Rz represent a rotation with respect to the X-, Y- and Z-axis and where dist_A_B represents a distance between A and B, where in this expression A and B may be replaced by any interferometer or encoder. Further, the term Z component refers to a component or a distance in a direction parallel to the Z-axis as shown in FIGS. 3 and 4, and the term chuck refers to the substrate table.

Further, it is remarked that the first and second encoders are separated from each other in a direction parallel to the Y-axis while the third encoder is separated from the first and second encoders in a direction parallel to the Z-axis. The Ry is determined from measurements by the first and second encoder. A distance between the encoders may be smaller than a distance between the interferometers, because most of the measurements are close to the Y-axis of the projection system. Therefore, a rotation around the Y-axis (Ry) with such a short arm will have less influence. Thus, a required Ry accuracy for compensation of the arm is relatively small. It is noted that the term separated in the context of e.g. the encoders or the interferometers are separated may be understood as referring to a physical distance between the measurement beams thereof, while this wording does not say anything about a physical positioning of a remainder of the interferometer or encoder in question. Also, the wording 'are separated in a direction . . . . ' Does not exclude a separation in any other direction, thus e.g. the wording 'interferometers IF1 and IF3 are separated in a direction along the Z-axis' does not exclude any separation along any other axis, thus the beams of these interferometers are in this example not necessarily located purely vertical with respect to each other.

FIG. 4 further shows the second measurement system SMS which comprises a fourth interferometer IF4, a fifth interferometer IF5, and a sixth interferometer IF6. Further, the second measurement systems SMS comprises a fourth encoder Enc4, a fifth encoder Enc5, and a sixth encoder Enc6. In an advantageous embodiment, the fourth and fifth interferometers IF4, IF5, are separated from each other in a direction parallel to the second axis. The sixth interferometer may be separated from the fourth and fifth interferometers in a direction parallel to the first axis. The fifth and sixth encoders Enc5, Enc6, may comprise a scale to measure a position in a direction substantially parallel to the Y-axis, while the fourth encoder Enc4 may comprise a scale to measure a position in a direction substantially to the second axis. The fifth and sixth encoders Enc5, Enc6, may be separated from each other in a direction parallel to the second axis. With this combination of encoders and interferometers comprised in the second measurement system, a position of the intermediate structure with regard to the reference structure may be calculated as follows:

$$Rx\_frame=(IF6-IF5)/(dist\_if6\_if5)$$

$$Ry\_frame=(IF5-IF4)/(dist\_if5\_if4)$$

$$Rz\_frame=(Enc6-Enc5)/(dist\_Enc6\_Enc5)$$

$$X\_frame=Enc4+Rz\_frame*Dist\_Enc4\_side\_of\_the\_mirrorbl,Y\text{component}$$

$$Y\_frame=(Enc6+Enc5)/2+Rx\_frame*(dist\_Enc6/Enc5\_IF1,Z\text{component})$$

$$Z\_frame=(IF5+IF4)/2+Rx\_frame*Dist\_IF4/IF5\_side\_of\_the\_mirrorbl,X\text{component}$$

wherein Rx_frame, Ry_frame, etc represent a rotation of the frame, i.e. a rotation of the intermediate structure around the X-axis, the Y-axis, etc., while X_frame, Y_frame etc. represent a position of the frame, i.e. the intermediate structure along the X-axis, Y-axis, etc.

To prevent and/or to dampen a vibration of the intermediate structure, the intermediate structure may be connected e.g. at an extreme thereof to the first drive mechanism (or to any other suitable part) by a leaf spring or any other resilient or flexible member.

To obtain an accurate relationship between a measurement by the first measurement system FMS and a measurement by the second measurement system SMS, the intermediate structure may comprise a material having a high thermal stability such as an invar material, and it preferably comprises a high stiffness. To achieve such high stiffness, the intermediate structure preferably comprises a rectangular hollow or massive bar.

Figure 5:
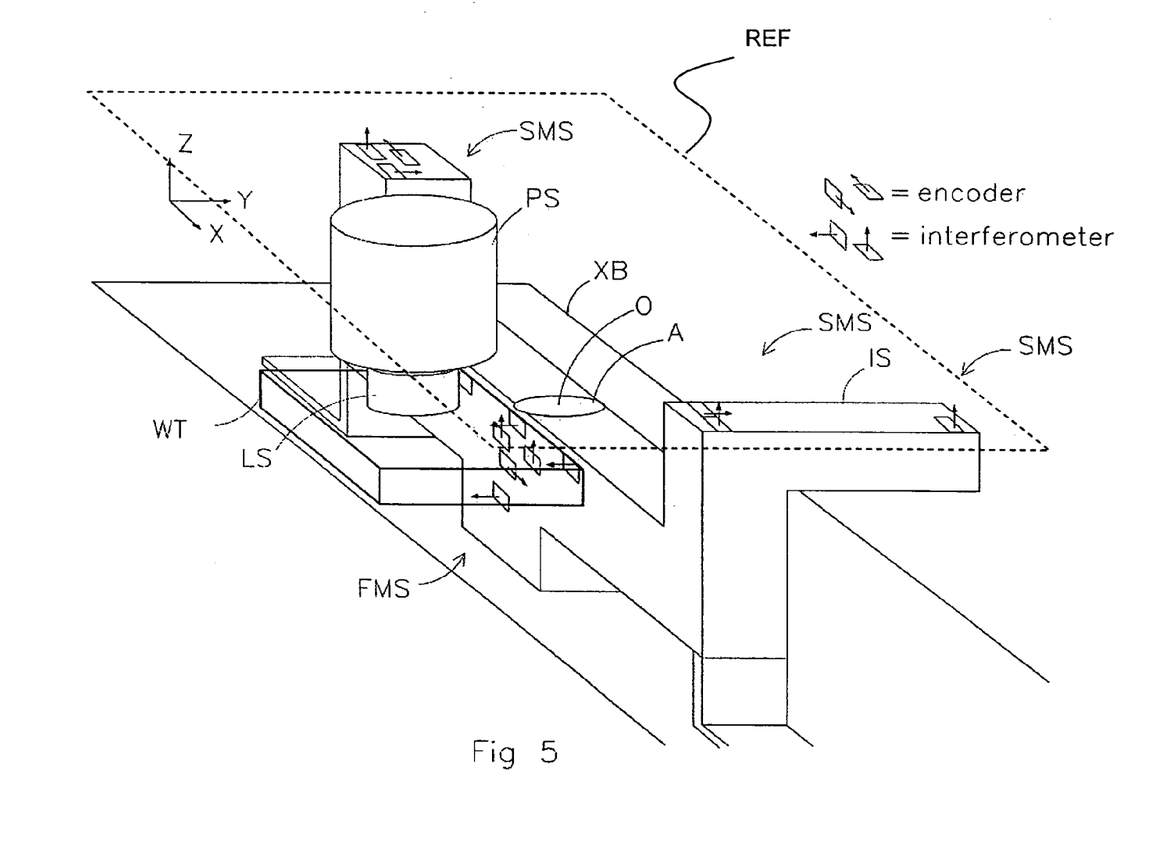
FIG. 5 depicts a perspective view of a part of a lithographic apparatus according to another embodiment of the invention.

A further advantageous application of the intermediate structure will be described with reference to FIG. 5. FIG. 5 depicts the substrate table WT, intermediate structure IS, first measurement system FMS and second measurement system SMS, similar or identical to the ones described with reference to the previous figures. Further, FIG. 5 depicts the X-beam XB as described above. Further, the projection system PS is highly schematically indicated. Between the projection system PS (or more precisely between a down stream lens of the projection system PS) and the substrate held by the substrate table WT, a fluid supply system LS may be positioned to provide an immersion fluid (a liquid or a gas) to fill a space between the down stream projection element or projection lens and the substrate. Although immersion lithography provides a number of advantages in terms of resolution capability and optical imaging, a disadvantage is that a replacement of the substrate requires a complicated closing mechanism to prevent immersion fluid in the fluid supply system LS from flowing away when the substrate is exchanged. According to an aspect of the invention, the intermediate structure IS may by applied to close the fluid supply system, thus preventing fluid from flowing out when e.g. replacing or moving away the substrate held by the substrate table WT. Therefore, the lithographic apparatus may be arranged to move to the substrate table WT plus the intermediate structure along the Y-axis in a direction to the left in the plane of drawing of FIG. 5, thus causing the projection system and fluid supply system to face the intermediate structure, in particular an area A thereof. The surface of the area A of the intermediate structure is now able to close the fluid supply system thus preventing immersion liquid from flowing away. In this situation, it is possible to perform a pressure measurement relating to the pressure of the immersion fluid (immersion liquid or immersion gas) in the fluid supply system, as the pressure may be derived from a displacement of the intermediate structure in this position, thus when the area A is applied as a closure plate for closing the fluid supply system. The higher a pressure of the immersion liquid, the more a displacement of the intermediate structure may be observed, which may e.g. be detected by the second measurement system SMS. As the second measurement system provides a position of the intermediate structure in six degrees of freedom, as outlined above, information about the pressure profile may be derived from the read out of the second measurement system to, as a rotation of the intermediate structure may be a result of e.g. a pressure difference observed by the intermediate structure IS at different parts of the area A. Thus, a sample pressure measurement device may be implemented to measure a pressure and/or a pressure profile of the immersion fluid in the liquid supply system, also indicated as immersion hood. The pressure measurement device may comprise, in addition or instead of the pressure measurement as described above, a plurality of sensors, such as pressure sensors, arranged in or on the intermediate structure, in particular in or on the surface A thereof. Thus, a pressure of the immersion fluid may be easily derived from a reading of these sensors. The sensors may comprise sensors to provide a pressure profile.

Although marked in FIG. 5 by a circle, the area A may of coarse form an integral part of the surface of the intermediate structure or may have any other suitable shape (such as rectangular, ellipse shaped, etc.). The area A may have a size which is substantially equal to a size of the liquid supply system or to a size of substrate, however the area A may also have a larger size which provides the advantage that it allows movement of the substrate table and thus possibly also of the intermediate structure connected to it, as the area A may is such case be large enough so that only a part of it provides the function of closing the liquid supply system and/or performing the measurements as described below. Thus, flexibility may be offered thereby, as some movements of the substrate table, e.g. in y direction, may be allowed as a size of the area A may be sufficiently large to cover such movements. This may allow some freedom of movement for the substrate table when performing activities in parallel by the lithographic apparatus, e.g. exchanging the substrate, swapping substrate tables in a dual stage lithographic apparatus etc., while at a same time offering immersion fluid supply closing functions and/or measuring functions by the intermediate structure as described here.

Also, the intermediate structure may comprise an immersion fluid filtration device to filter the immersion fluid. The filtration device may comprise an inlet, a filter and an outlet, the inlet leading from the surface of the area A and the outlet leading towards the surface of the are A. The filter may e.g. be located in the intermediate structure below the area A, the inlet and outlet leading from the filter to the area A. Further, it is possible that the surface of the intermediate structure to close the fluid supply system, e.g. the area A, comprises a surface roughness which is substantially equal to a surface roughness of the substrate, thus providing substantially a same circulation resistance for a circulation of the immersion fluid, thus providing for a circulation of the immersion fluid which substantially equals a circulation of the fluid when the fluid supply system is closed by the substrate instead of by the area A, which therefore enables a highly accurate pressure measurement by the pressure measurement device described above, as a circulation of the fluid when closed by the area A substantially equals a circulation of the fluid when closed by the substrate.

The measurement system and intermediate structure may not only be applied for a lithographic apparatus, but may be applied for any position apparatus in general, the positioning apparatus comprising a substrate table constructed to hold a substrate, a reference structure and a measurement system to measure a position of the substrate table with respect to the reference structure, wherein the measurement system comprises a first measurement system to measure a position of the substrate table with respect to an intermediate structure, and a second measurement system to measure a position of the intermediate structure with respect to the reference structure. Preferred embodiments of the lithographic apparatus as described above may also be implemented with the positioning apparatus as described here, providing same of similar advantages and effects.

The intermediate structure, preferably the area A thereof, may, in addition to or in stead of the features described above, further comprise one or more optical sensors O, such as a dose sensor to measure a dose as projected by the projection system, an image sensor such as a TIS (Transmission Image Sensor) sensor to measure an image plane flatness or an aerial image as projected by the projection system, and/or an aberration sensor to measure an aberration of the projection system. Measurements may be performed with these sensors when the intermediate structure has been positioned to e.g. hold the immersion fluid, thus the intermediate structure (and in particular the area A thereof) being positioned at or near a plane of focus of the projection system. An advantage is that a higher throughput and a better performance of the lithographic apparatus may be provided thereby: in the state of the art, optical sensors as described above may have been comprised in the substrate table thus requiring an accurate positioning of the substrate table when performing measurements making use of these optical sensors. According to the embodiment described here, such measurements may be performed while only the intermediate structure is positioned to perform the measurements with the sensors, the substrate table may be used for other tasks at that moment in time (e.g. exchanging a wafer), thus allowing these tasks to be performed in parallel. During e.g. an exchanging or swapping of wafer stages after exposures or whenever immersion fluid is held with the aid of the intermediate structure, parameters as the dose, the image plane flatness and the lens aberrations may now be measured substantially without additional time as no additional movements (e.g. to move a sensor assembly to a suitable location in or near the plane of focus) are required. Further, it is also possible that the sensors are movable with respect to the intermediate structure, which may be advantageous in case that the intermediate structure cannot move in x, y and/or z direction during a swap of the substrate or during the fluid holding. In this case, the intermediate structure may comprise positioning sensors (e.g. interferometers, piezo etc) to identify (a position of) the movable sensor(s) comprised in the intermediate structure.

Figure 6:
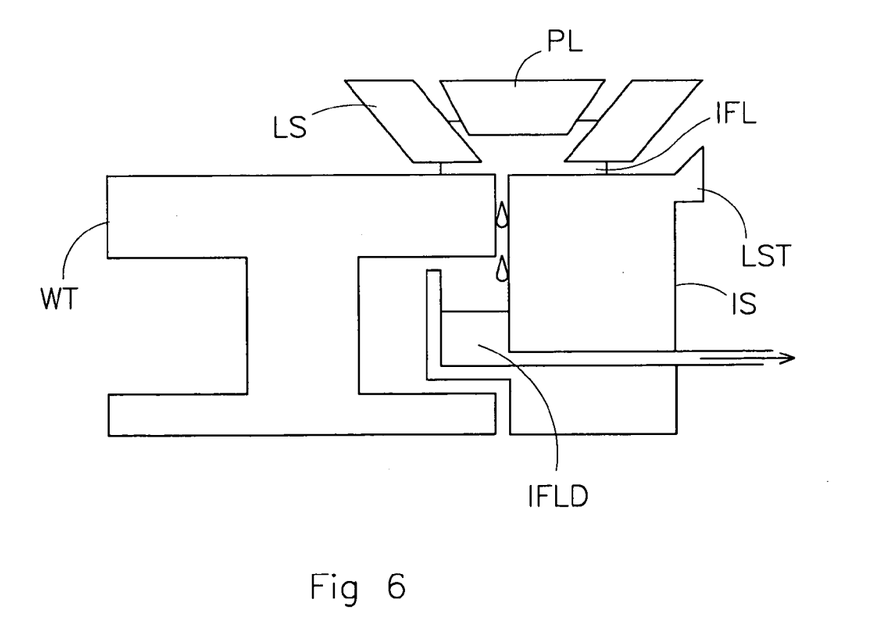
FIG. 6 highly schematically depicts a view of a part of a lithographic apparatus according to still another embodiment of the invention.

FIG. 6 shows a schematic side view of an embodiment of the substrate table WT, the intermediate structure IS, the fluid supply system LS to hold the immersion fluid IFL and a lens at the downstream end of the projection system PS. The intermediate structure comprises an immersion fluid leakage drain IFLD to drain any immersion fluid which may leak between the substrate table WT and the intermediate structure IS when applying the intermediate structure as described with reference to FIG. 5. The drained immersion liquid may be reused, e.g. after filtering it by a suitable filtration device. A leakage stopper LST may be provided at an edge of a surface of the intermediate structure which surface may face the projection system, thus preventing a drain of immersion fluid at the edge.

Instead of or in addition to the first and second measurement system described above, the first and second measurement systems may also comprise (but not limited to) capacitive sensors, photonic sensors, eddy current sensors, magnetic encoders or any other sensor that can preferably achieve (sub-) nm accuracy.

The measurement system of the lithographic apparatus and positioning apparatus as described here may not only be applied for measuring a position of the substrate table, but may also be applied for measuring a position of any movable part with respect to the reference structure, the first measurement system, thus measuring a position of the movable part with respect to the intermediate structure. Thus, in the context of this document the wording 'substrate table' may also be understood as to comprise any movable part of the lithographic apparatus and/or the positioning apparatus.

Further, it is remarked that this invention is not limited to sensor heads on the intermediate structure and targets (e.g. mirrors and scales) on the substrate table and the reference structure respectively. One or more of the sensor heads may also be mounted on the substrate table (or reference frame) with the targets on the intermediate structure.

Still further, for symmetry purposes a redundant interferometer ( e.g. indicated as IF7) can be added having a same X and Z position as interferometer IF 4 but having with regard to interferometer IF4 a same Y displacement as a distance between IF5 and IF6. This additional interferometer makes a metrology modeling easier and may improve accuracy of the position measurements even further.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a substrate table constructed to hold a substrate;
   a reference structure moveable to follow a movement of the substrate table; and
   a measurement system to measure a position of the substrate table with respect to the reference structure, the measurement system comprising:
      a first measurement system to measure a position of the substrate table with respect to an intermediate structure, and
      a second measurement system to measure a position of the intermediate structure with respect to the reference structure.

2. The lithographic apparatus according to claim 1, comprising a first drive mechanism to move the substrate table along a first axis, the intermediate structure being connectable to the first drive mechanism to follow the movement of the substrate table along the first axis.

3. The lithographic apparatus according to claim 2, wherein the first axis extends along a surface of the reference structure, the first drive mechanism to move the intermediate structure substantially parallel to the first axis.

4. The lithographic apparatus according to claim 2, comprising a second drive mechanism to move the substrate table along a second axis, the first and second axis defining a plane, the surface of the reference structure extending substantially parallel to the plane.

5. The lithographic apparatus according to claim 4, wherein the second drive mechanism is arranged to move the substrate table with respect to the first drive mechanism.

6. The lithographic apparatus according to claim 1, wherein the first measurement system in operation generates a plurality of first optical measurement beams between the substrate table and the intermediate structure, the first optical measurement beams in a direction substantially parallel to a first axis.

7. The lithographic apparatus according to claim 6, wherein the second measurement system in operation generates a plurality of second optical measurement beams between the intermediate structure and the reference structure, the second optical measurement beams in a direction perpendicular to the first axis.

8. The lithographic apparatus according to claim 7, wherein the second optical measurement beams are substantially perpendicular to the plane defined by the first axis extending horizontally and a second horizontal axis perpendicular to the first axis.

9. The lithographic apparatus according to claim 7, wherein the second optical measurement beams are substantially parallel to a second horizontal axis perpendicular to the first axis.

10. The lithographic apparatus according to claim 1, wherein the first measurement system comprises a first, a second, and a third interferometer, and a first, a second and a third encoder.

11. The lithographic apparatus according to claim 10, wherein the first and the second interferometer are separated from each other in a direction parallel to a second axis perpendicular to a first axis, and wherein the third interferometer is separated from the first and second interferometers in a direction perpendicular to the first and second axis.

12. The lithographic apparatus according to claim 10, wherein the first and second encoder comprise a scale to measure a position in a direction substantially perpendicular to a first axis and a second axis perpendicular to the first axis, the third encoder comprising a scale to measure a position in a direction substantially parallel to the second axis.

13. The lithographic apparatus according to claim 12, wherein the first and second encoder are separated from each other in the direction parallel to the second axis, the third encoder being separated from the first and second encoder in the direction perpendicular to the first and second axis.

14. The lithographic apparatus according to claim 1, wherein the second measurement system comprises a fourth, a fifth, and a sixth interferometer, and a fourth, a fifth and a sixth encoder.

15. The lithographic apparatus according to claim 14, wherein the fourth and the fifth interferometer are separated from each other in the direction parallel to a second axis perpendicular to a first axis, and wherein the sixth interferometer is separated from the fourth and fifth interferometers in a direction parallel to the first axis.

16. The lithographic apparatus according to claim 15, wherein the fifth and sixth encoder comprise a scale to measure a position in the direction substantially parallel to the first axis, the fourth encoder comprising a scale to measure a position in the direction substantially parallel to the second axis.

17. The lithographic apparatus according to claim 16, wherein the fifth and sixth encoder are separated from each other in the direction parallel to the second axis.

18. The lithographic apparatus according to claim 2, wherein an extreme of the intermediate structure is connected to the first drive mechanism by a leaf spring.

19. The lithographic apparatus according to claim 1, wherein the intermediate structure is at least partly comprised of an invar material.

20. The lithographic apparatus according to claim 1, wherein the intermediate structure extends between the substrate table and the reference frame.

21. The lithographic apparatus according to claim 1, wherein the lithographic apparatus is constructed to move the intermediate structure under an immersion hood of the lithographic apparatus when moving the substrate away from the immersion hood, a surface of the intermediate structure to close the immersion hood.

22. The lithographic apparatus according to claim 21, comprising a pressure measurement device to measure a pressure of an immersion fluid in the immersion hood, the pressure measurement device deriving a pressure from a displacement of the intermediate structure when serving to close the immersion hood.

23. The lithographic apparatus according to claim 21, comprising a pressure measurement device to measure a pressure of an immersion fluid in the immersion hood, the pressure measurement device comprising a plurality of pressure sensors arranged in the intermediate structure.

24. The lithographic apparatus according to claim 21, wherein the intermediate structure comprises an immersion fluid filtration device.

25. The lithographic apparatus according to claim 21, wherein the surface of the intermediate structure to close the immersion hood comprises surface roughness which is substantially equal to a surface roughness of the substrate.

26. The lithographic apparatus according to claim 21, wherein a surface of the intermediate structure facing a projection system of the lithographic apparatus, preferably the surface of the intermediate structure to close the immersion hood, comprises an optical sensor comprising one or more selected from a group of sensors comprising a dose sensor to measure a dose as projected by the projection system, an image sensor to measure an image plane flatness or an aerial image as projected by the projection system, and/or an aberration sensor to measure an aberration of the projection system.

27. A positioning apparatus comprising:
a substrate table constructed to hold a substrate;
a reference structure moveable to follow a movement of the substrate table; and
a measurement system to measure a position of the substrate table with respect to the reference structure, the measurement system comprising:
a first measurement system to measure a position of the substrate table with respect to an intermediate structure, and
a second measurement system to measure a position of the intermediate structure with respect to the reference structure.

28. The positioning apparatus according to claim 27, comprising a first drive mechanism to move the substrate table along a first axis, the intermediate structure being connectable to the first drive mechanism to follow the movement of the substrate table along the first axis.

29. The positioning apparatus according to claim 28, wherein the first axis extends along a surface of the reference structure, the first drive mechanism to move the intermediate structure substantially parallel to the first axis.

30. The positioning apparatus according to claim 28, comprising a second drive mechanism to move the substrate table along a second axis, the first and second axis defining a plane, the surface of the reference structure extending substantially parallel to the plane.

31. The positioning apparatus according to claim 30, wherein the second drive mechanism is arranged to move the substrate table with respect to the first drive mechanism.

32. The positioning apparatus according to claim 27, wherein the first measurement system in operation generates a plurality of first optical measurement beams between the substrate table and the intermediate structure, the first optical measurement beams in a direction substantially parallel to a first axis.

33. The lithographic apparatus according to claim 32, wherein the second measurement system in operation generates a plurality of second optical measurement beams between the intermediate structure and the reference structure, the second optical measurement beams in a direction perpendicular to the first axis.

* * * * *